United States Patent
Behrends et al.

(10) Patent No.: US 9,046,588 B2
(45) Date of Patent: Jun. 2, 2015

(54) METHOD AND SYSTEM FOR DETECTING AN ARC FAULT IN A PHOTOVOLTAIC POWER SYSTEM

(71) Applicant: SMA Solar Technology AG, Niestetal (DE)

(72) Inventors: Holger Behrends, Kassel (DE); Sebastian Bieniek, Niestetal (DE); Thorsten Buelo, Kassel (DE); Markus Hopf, Espenau (DE); Gerd Bettenwort, Kassel (DE); Marcel Kratochvil, Kassel (DE); Christopher Merz, Daubach (DE); Oliver Prior, Marsberg (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 14/105,377

(22) Filed: Dec. 13, 2013

(65) Prior Publication Data
US 2014/0119072 A1    May 1, 2014

Related U.S. Application Data

(63) Continuation of application No. PCT/EP2011/061251, filed on Jul. 4, 2011.

(51) Int. Cl.
| | |
|---|---|
| H02H 3/00 | (2006.01) |
| G01R 31/40 | (2014.01) |
| H02H 1/00 | (2006.01) |
| H01L 31/02 | (2006.01) |
| H02S 50/10 | (2014.01) |
| H02H 7/20 | (2006.01) |

(52) U.S. Cl.
CPC ........... *G01R 31/405* (2013.01); *H02H 1/0015* (2013.01); *H02H 7/20* (2013.01); *H01L 31/02021* (2013.01); *Y02E 10/50* (2013.01); *H02S 50/10* (2014.12)

(58) Field of Classification Search
USPC ........................................................... 361/42
See application file for complete search history.

(56) References Cited

U.S. PATENT DOCUMENTS

| | | | |
|---|---|---|---|
| 8,242,634 B2 * | 8/2012 | Schatz et al. ..................... 307/82 |
| 8,410,950 B2 * | 4/2013 | Takehara et al. .............. 340/635 |
| 2011/0019444 A1 * | 1/2011 | Dargatz et al. .................. 363/50 |
| 2011/0141644 A1 | 6/2011 | Hastings et al. |

OTHER PUBLICATIONS

International Search Report & Written Opinion of the International Searching Authority dated Feb. 12, 2012 for International application No. PCT/EP2011/061251. 10 Pages.

* cited by examiner

*Primary Examiner* — Adolf Berhane
*Assistant Examiner* — Afework Demisse
(74) *Attorney, Agent, or Firm* — Eschweiler & Associates, LLC

(57) ABSTRACT

A method for detecting an arc fault in a photovoltaic power circuit includes operating a photovoltaic generator at a first working point. A first signal related to a DC-current and/or a DC-voltage in the power circuit is determined. The first signal is analyzed and it is determined whether the signal indicates the presence of an electric arc in the power circuit. If so, the photovoltaic generator is operated at a second working point and a second signal related to the DC-current and/or the DC-voltage is determined. The first and second signals are then compared; and the occurrence of an arc fault in the power circuit is selectively signaled based on the comparison.

11 Claims, 6 Drawing Sheets

US 9,046,588 B2

METHOD AND SYSTEM FOR DETECTING AN ARC FAULT IN A PHOTOVOLTAIC POWER SYSTEM

REFERENCE TO RELATED APPLICATION

This application is a continuation of International application number PCT/EP2011/061251 filed on Jul. 4, 2011.

FIELD

The disclosure relates to a method and a system for detecting an arc fault in a photovoltaic power circuit. The disclosure further relates to an inverter for a photovoltaic system comprising a corresponding detection system.

BACKGROUND

Photovoltaic (PV) power circuits usually operate at high DC- (direct current) voltages and high currents and are thus prone to the development of electric arcs. Electric arcs can for example occur when a power line with a high current load is interrupted during maintenance or in case contacts at interconnectors are degraded. Other possible courses for arc faults, i.e. the occurrence of an electric arc in the power circuit, are corroded solder joints or broken insulators of the power lines. Arc faults are the most common fire courses in photovoltaic systems. This also reflects in the requirements for arc fault protection for photovoltaic systems as for example regulated by the national Electric Code (NEC) 690.11 of the United States of America coming into force in 2011.

A reliable arc fault detection method and system is therefore of major importance. On the one hand, for security reasons the existence of an arc fault has to be detected with a reliability as high as possible. On the other hand, the probability of an erroneous indication of a supposed arc fault has to be as low as possible, in particular if an erroneous detection of an arc fault might lead to a shutdown of a photovoltaic system without the option to automatically restart it, as for example specified in the before mentioned NEC 690.11 code.

Electric arcs usually emit a broadband AC (Alternating Current)-signal in an RF (Radio Frequency)-frequency range. Detection systems for arc faults are based on detecting an according radio frequency signal in the power circuit and are well established and for example known from document WO 95/25374. A disadvantage of such detection systems is that measurement electronics capable of performing AC- or even RF-measurements is needed.

The development or the presence of an arc does also change the DC-characteristics of a power circuit. DC-measurement equipment is usually already present in a photovoltaic power circuit, e.g. for setting a working point of a PV-generator. In order to minimize the number and complexity that have to be added to a PV-system in order to implement an arc detection system, a detection method and system based on DC-measurements within a power circuit would be desirable. However, the impact of an arc on the DC-characteristics is relatively small and accordingly, arc detections based on DC-measurements within a power circuit within a PV-power system are not known to be particularly reliable.

Document US 2011/0019444 A1 describes an arc detection system based on DC-measurements, in which a higher reliability is obtained by analyzing a DC-current signal as well as a DC-voltage signal. The presence of an arc is signaled only if it is indicated by both signals. Furthermore, after a successful detection of an arc, a distinction between a parallel and a series arc is performed by analyzing the current signal while a short cut of the generator is established.

It is desirable to create a more robust and reliable method and system for detecting arc faults in a power circuit based on DC-measurements. It is furthermore desirable to describe a photovoltaic system with a corresponding detection system.

SUMMARY

According to a first aspect of the disclosure, a method for detecting an arc fault in a PV-power circuit comprising a PV-generator is disclosed. The method comprises operating a PV-generator at a first working point and determining a first signal related to a DC-current flowing in the power circuit and/or a DC-voltage present in the power circuit. The method further comprises analyzing the first signal and determining whether the first signal indicates the presence of an electric arc in the power circuit. In case the first signal indicates the presence of an electric arc in the power circuit, the method comprises operating the photovoltaic generator at a second working point and determining a second signal related to the DC-current flowing in the power circuit and/or the DC-voltage present in the power circuit. The method further comprises comparing the first signal and the second signal and signaling an occurrence of an arc fault in the power circuit if a result of the comparison indicates the presence of an electric arc.

The operation at a second working point gives the possibility to gather additional information on the working conditions of the PV-power circuit. The additional information enhances the reliability of the arc detection and allows to validate a first indication of an arc that had only been based on the limited information obtained during operation at the first working point. The method can be performed by analyzing values (current, voltage) that are anyway measured during operation. No additional specialized equipment is needed, for example, no RF measurements have to be performed.

In one embodiment of the method, the second working point is distinctly different from the first working point. This way, the gain of additional information is particularly large.

In one embodiment of the method, the second working point corresponds to operating the PV-generator at its open-loop voltage. Further, the occurrence of an arc fault is signaled, if the voltage determined as the second signal is lower than the open-loop voltage. This way, the characteristic and unavoidable voltage drop of an arc is utilized for its detection.

In one embodiment of the method, analyzing the first signal comprises determining whether the first signal shows an unexpected value for the DC-voltage and/or the DC-current and/or an unexpected value for a derivative with respect to time of the DC-voltage and/or of the DC-current, wherein an observation of such an unexpected value is regarded as an indication of the presence of an electric arc.

According to a second aspect of the disclosure, an arc fault detection system is designed to perform a method as described above. According to further aspects, a PV-power system and an inverter for a PV-power system comprise an arc fault detection system according to the second aspect. The advantages of the second and the further aspects correspond to the advantages of the first aspect.

According to another embodiment, an arc fault detection system for detecting an electric arc in a photovoltaic generator system is disclosed. The arc fault detection system comprises a control unit that is configured to operate the photovoltaic generator system at a first working point, determine a first signal related to a current flowing into or out of the power circuit and/or a DC-voltage present at an input or an output of the power circuit, and analyze the first signal and determine whether the first signal indicates a presence of an electric arc in the power circuit. In case the first signal indicates the presence of an electric arc in the power circuit, the control unit is configured to operate the photovoltaic generator at a second working point, and determine a second signal related to the current flowing into or out of the power circuit and/or the voltage present at the input or output of the power circuit. The control unit is further configured to compare the first signal and the second signal, and signals the occurrence of an arc fault in the power circuit if a result of the comparison indicates the presence of an electric arc.

According to another embodiment, an inverter for a photovoltaic power system is disclosed, wherein the inverter is configured to receive a DC input voltage at DC input lines and generate an AC voltage at AC output lines. The inverter comprises a control unit with an integrated arc fault detection system that is configured to receive an input voltage or input current as inputs, or receive an output voltage or output current as inputs at two distinctly different working points, compares the inputs at the two distinctly different working points, and selectively signal an occurrence of an electric arc based on the comparison.

According to yet another embodiment, a method for detecting an arc fault in a photovoltaic power circuit comprising a photovoltaic generator comprises operating the photovoltaic generator at a first working point, determining a first signal related to a current flowing into or out of the power circuit and/or a DC-voltage present at an input or an output of the power circuit, and analyzing the first signal and determining whether the first signal indicates a presence of an electric arc in the power circuit. In case the first signal indicates the presence of an electric arc in the power circuit, the method comprises operating the photovoltaic generator at a second working point, and determining a second signal related to the current flowing into or out of the power circuit and/or the voltage present at the input or output of the power circuit. The method further comprises comparing the first signal and the second signal, and signaling the occurrence of an arc fault in the power circuit if a result of the comparison indicates the presence of an electric arc.

Further developments and embodiments are subject of the dependent claims.

BRIEF DESCRIPTION OF THE DRAWINGS

The disclosure is now described in more detail and will be fully understood with reference to the following detailed description in conjunction with the drawings. The drawings show.

DETAILED DESCRIPTION

Figure 1:
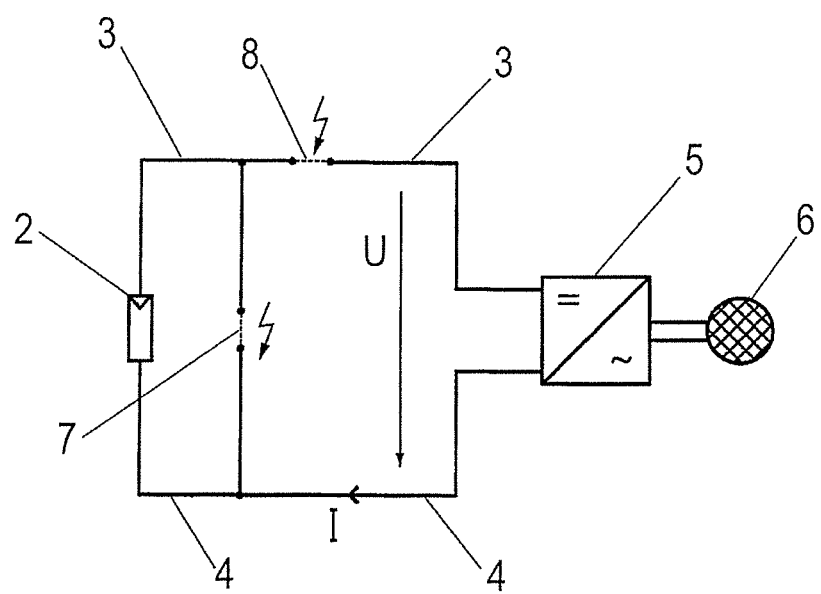
FIG. 1 a schematic wiring diagram of a photovoltaic system.

FIG. 1 shows a photovoltaic system, in the following abbreviated as PV-system, in a schematic wiring diagram. The PV-system comprises a DC-power circuit 1 with a photovoltaic generator 2 (PV-generator 2) that is connected to an inverter 5, e.g. a DC/AC (Direct Current/Alternating Current)-converter, by way of DC-power lines 3, 4. The inverter 5 is connected to a power grid 6 on its AC-side.

The power grid 6 can either be a private or a public power grid. By way of example the power grid 6 is a single-phase system. However, the disclosure can be realized with a power grid and/or inverter operating with any number of phases, for example two or three phases.

Also by way of example, the PV-generator 2 is symbolized by the circuit symbol of a single photovoltaic cell. In a realization of the shown PV-system 1, the PV-generator 2 can for example be a single photovoltaic module (PV-module) that itself comprises a plurality of photovoltaic cells. In another embodiment, the PV-generator 2 can comprise a plurality of PV-modules that, for example, are connected in series and form a so-called string. Furthermore, a parallel connection or a combined serial/parallel connection of PV-modules is possible.

In case the PV-generator 2 is a PV-module, the inverter 5 can be integrated into the PV-module, e.g. in a connection box located on the rear side of the module. An inverter integrated into a module is sometimes also called a "module-inverter".

Two different kinds of arc faults that can occur in the power circuit 1 formed by the PV-generator 2, the power lines 3, 4 and the input state of the inverter 5 are depicted in FIG. 1. The first kind is a parallel arc 7 burning in parallel to the PV-generator 2 as the power source of the power circuit. The second kind is a series arc 8 that is electrically in series with the PV-generator 2 and located at an interruption within one of the power lines 3, 4. The two different kinds of arc 7, 8 are symbolized in FIG. 1. By way of example, the series arc 8 is located in power line 3. Also by way of example, the parallel arc 7 is located in parallel to the PV-generator 2. Generally, parallel arcs can develop between two points with different potentials. A parallel arc can thus also develop in parallel to a part of the PV-generator 2, e.g. be located in parallel to a single PV-module.

Furthermore, as a special case of a parallel arc, an electric arc can also develop against ground potential, for example in a situation, in which the power lines 3, 4 are installed in grounded metal pipes. An arc against ground potential is referred to as a ground arc in the following. A ground arc can for example develop between one of the power lines 3, 4 and ground potential, if the other power line 4, 3 is intentionally or unintentionally grounded.

Figure 2:
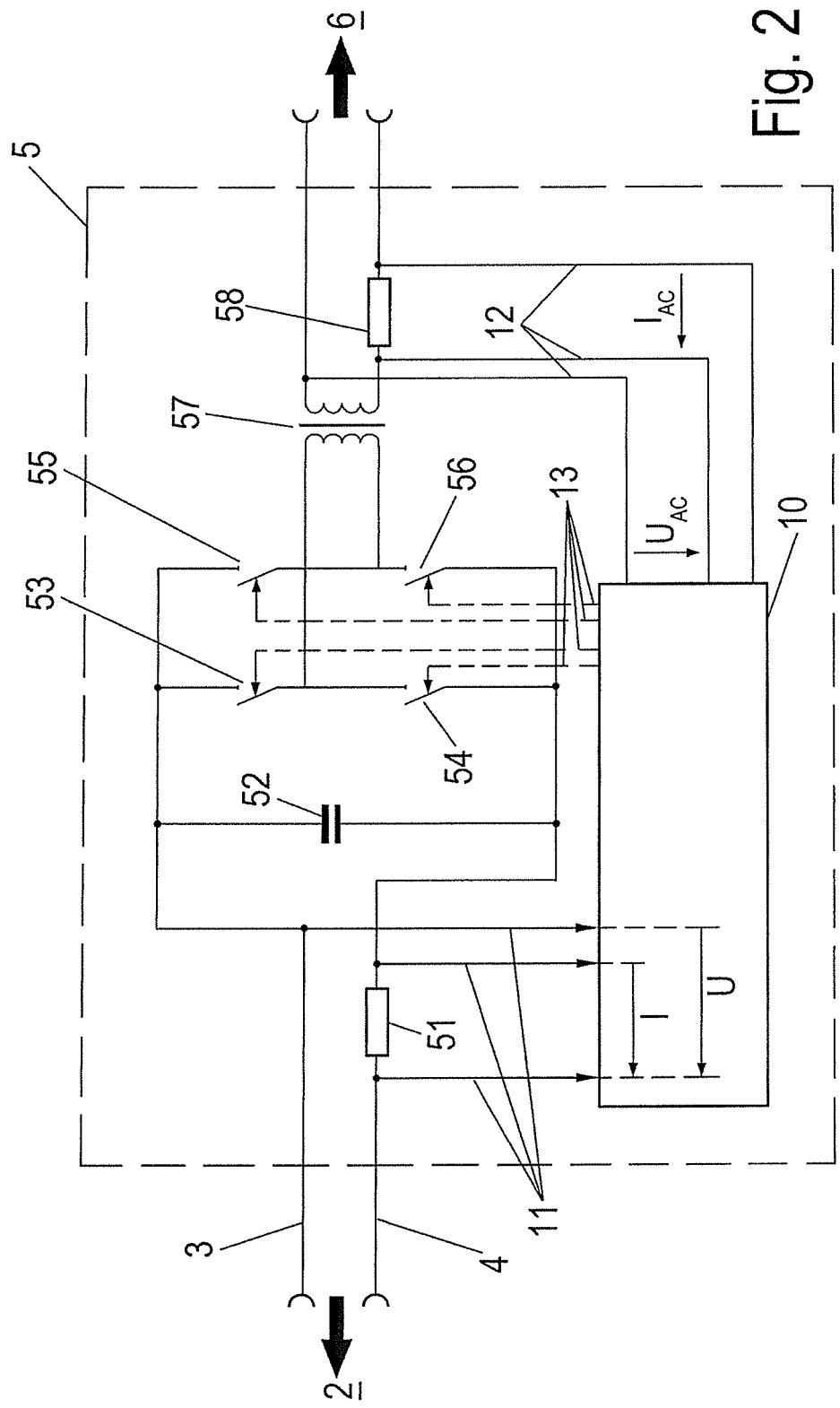
FIG. 2 a schematic block diagram of an inverter for a photovoltaic system with an arc detection system.

FIG. 2 shows an example of the inverter 5 of FIG. 1 in a schematic block diagram. Same reference numerals denote the same elements or elements with the same function in all figures of the application. As explained in more detail below, the inverter 5 shown in FIG. 2 has by way of example a single stage topology with a transformer. It is noted that other known topologies, in particular multi stage topologies can as well be used. The inverter can as well be designed without a transformer.

The inverter 5 shown in FIG. 2 comprises an inverter bridge fed by the DC input of the inverter 5 as supplied by the power lines 3, 4 via a shunt 51. A capacitor 52 is connected in parallel to the inverter bridge. The capacitor 52 diminishes voltage-ripples in the DC-power circuit due to the pulsed current load of the inverter bridge. By way of example, the inverter bridge is a full- or H-bridge with four switching elements 53-56 arranged in two branches. The switching elements are depicted as mechanical switches. In a realization of the inverter 5 the switches are usually controllable semiconductor switches such as bipolar transistors, MOSFETs (metal oxide semiconductor transistors) or IGBTs (insulated gate bipolar transistors). The center taps of the branches of the inverter bridge lead to a transformer 57, the output of which is connected to the power grid 6. Additionally, a sine filter e. g. comprising one or more capacitors could be present. The sine filter forms the output current to be as close as possible to a sine-wave.

The inverter 5 further comprises a control unit 10 with an integrated arc detection system. Control unit 10 has input lines 11 connected with the DC-power inputs of the inverter 5 and the shunt 51. Via the input lines 11, the control unit 10 can determine an input voltage U of the inverter 5 and an input current I flowing in the power circuit. The control unit 10 is furthermore connected to the AC-output of the inverter 5 via further input lines 12. Additionally, the control unit 10 is connected with the switches 53-56 via control lines 13 in order to control switching states of the switches 53-56.

The switches 53-56 are for example controlled according to a PWM-(pulse width modulation) method for converting DC-current provided by the PV-generator into AC-current fed into the power grid 6. The further input lines 12 are used to synchronize the magnitude and/or phase of an output voltage $U_{AC}$ and/or current $I_{AC}$ of the inverter 5 with the power grid 6. By way of example, the AC-current $I_{AC}$ is measured via a shunt 58 in the embodiment shown in FIG. 2. Other techniques for measuring currents, e.g. via hall sensors, can be used as well.

By controlling the switches 53-56, the control unit 10 is enabled to set a working point of the PV-power generator 2. A working point, sometimes also called operation point, is set by specifying a designated value for either of the three electrical measures: provided voltage, flowing current or delivered power of the PV-generator 2, wherein the power is given by the product of voltage and current. Usually, the control unit 10 comprises a means for automatically determining the designated value and setting the working point such that the PV-generator delivers the maximum power, called MPP (maximum power point)—tracker.

In the embodiment shown in FIG. 2, the switching state of the switches 53-56 can additionally be controlled by the integrated arc detection system, either directly or via setting a working point.

Figure 3:
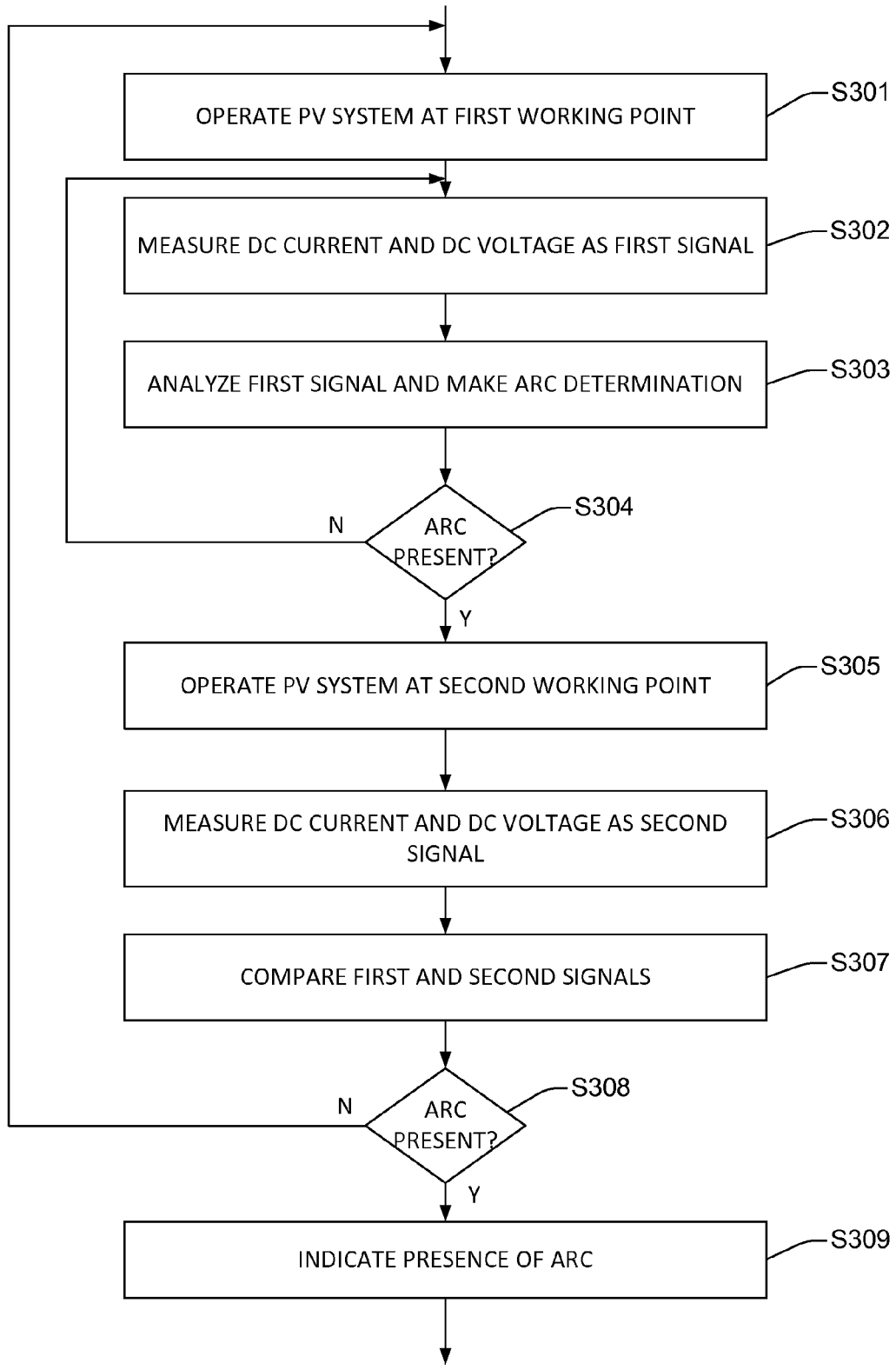
FIG. 3 a flow chart of an embodiment of a method for detecting the presence of an electric arc in a photovoltaic power circuit.

FIG. 3 shows a flow chart of a method for detecting electric arcs in a photovoltaic power circuit. The method can for example be performed within the photovoltaic system as shown in FIG. 1 and conducted by the arc detection system integrated in the control unit 10 of inverter 5 shown in FIG. 2. Without any limitation, the method will therefore by way of example be described with reference to FIGS. 1 and 2.

At S301, the power circuit, for example the photovoltaic system 1 shown in FIG. 1, is operated in a normal working condition at a first working point, which in one embodiment is determined by an MPP-tracker.

At S302, the DC-current I flowing in the power circuit and the DC-voltage U provided by the PV-generator 2 are measured. The measured values are referred to as the first signal. It is noted that due to a correlation between the values of DC-voltage, DC-current and DC-power and the values of AC-voltage, AC-current and AC-power (i.e. between the DC- and the AC-side of an inverter), the first signal can also be determined from a measurement of AC-values.

At S303, the first signal is analyzed and it is determined, whether the first signal indicates that an electric arc could be present in the power circuit. At S304, the method branches back to S302 for a repetition of acts S302 to S304 if the result of the analysis does not indicate the presence of an electric arc. If to the contrary the result of the analysis does indicate the presence of an electric arc, the method is continued at S305.

Figure 4:
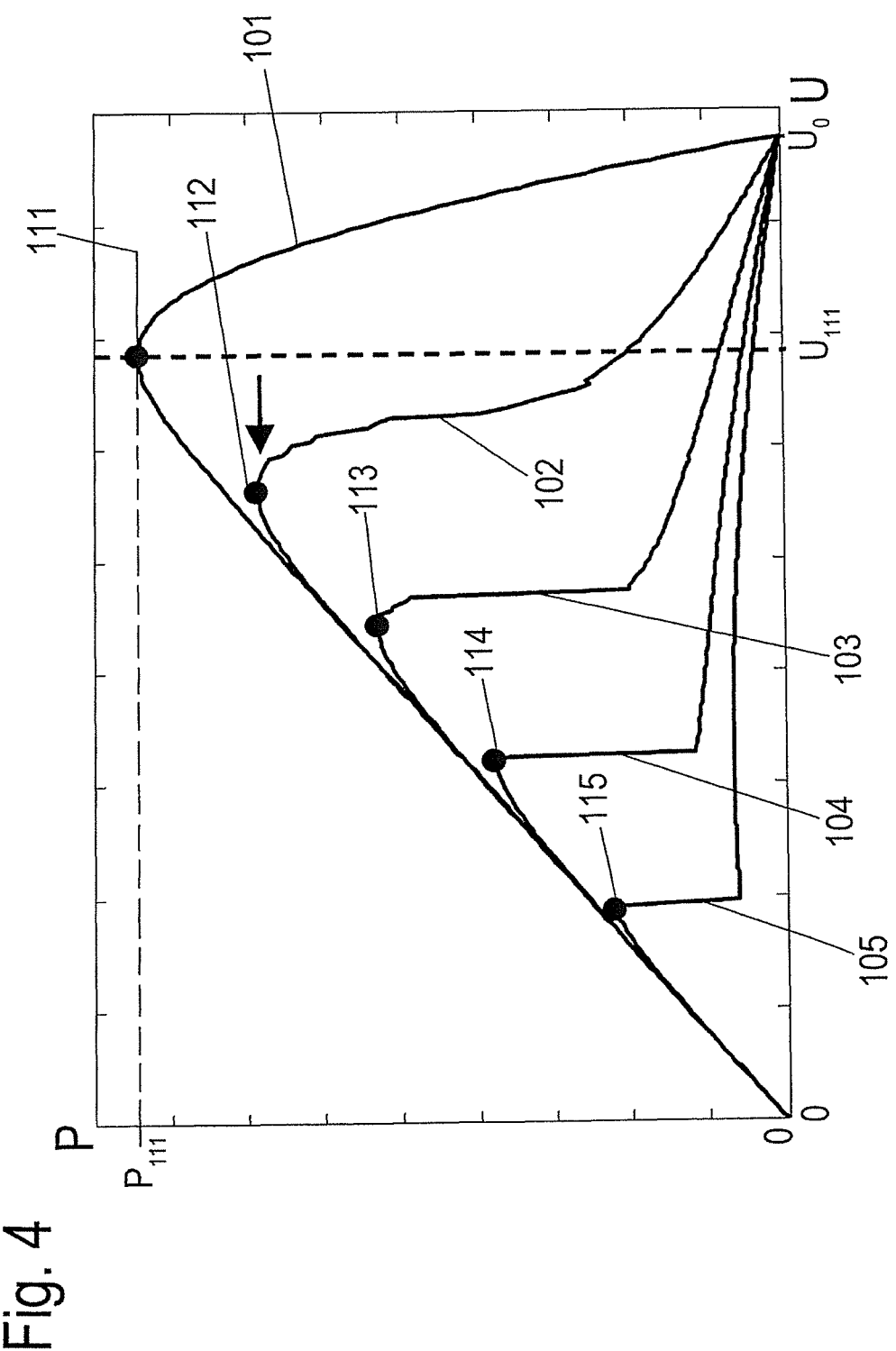
FIG. 4 a diagram of P/V-curves of a photovoltaic generator.

At S303, one or more different indications of electric arcs can be checked for. Indications are all deviations of the measured first signal from usual and expected values. Examples are given below. Furthermore, changes of the first signal measured in several repetitions of acts S302 and S303 can also be analyzed for an unusual behavior. An indication can be, amongst others, one of the following:

A first indication is given by an unexpected value of the voltage U measured at S302. FIG. 4 shows characteristic P/V (power vs. voltage)-curves of a PV-generator, e.g. the PV-generator 2 of FIG. 1, in a diagram. The operating voltage U of the PV-generator is recorded on the x-axis of the diagram; the power P delivered by the PV-generator is recorded on the y-axis of the diagram.

A P/V-curve 101 shows the characteristics of the PV-generator during its normal operation. The delivered power P rises monotonously with increasing voltage U, until a maximum power is reached. With further increasing voltage U, the power P decreases down to zero at an open-loop voltage $U_0$. The maximum of the curve is called MPP (maximum power point). In the case shown, the curve exhibits only one maximum, which is then called global MPP. It is noted that under some working conditions, e.g. if part of the PV-generator is shadowed, two or more local MPPs are observed. In that case, the MPP which is highest in delivered power is denoted as the global MPP.

During normal operation of the PV-generator according to a P/V-curve 101, the MPP-tracker will determine the MPP and set the PV-generator to operate at a working point 111 at a voltage value $U_{111}$ and a power value $P_{111}$. Since the working point 111 is determined by the MPP-tracker, it is called tracked working point 111 in the following. Usually, the voltage connected with the MPP lies in a relatively narrow range, e.g. approximately between 75% and 85% of the open-loop voltage of the PV-generator. Accordingly, it is expected that the voltage $U_{111}$ has a magnitude of approximately 75% to 85% of $U_0$.

The voltage drop along a burning arc amounts approximately to a couple of ten volts, wherein the height of the voltage drop is related to parameters of the arc, e.g. the distance that the arc spans. In FIG. 4, further P/V-curves 102-105 show the characteristics of the PV-generator while series arcs with different parameters are burning. It is noted that the further P/V-curves 102-105 stem from simulations of arcs and not from measurements. For this reason, the curves progress down to zero power, i.e. into a regime, where a real arc would be extinguished due to low current flowing. The further P/V-curves 102-105 also only exhibit one MPP each, which is located at a voltage lower than the voltage $U_{111}$ and at a power lower than the power value $P_{111}$. Assuming that the MPP-tracker has been able to follow a change in the characteristics when an arc develops as indicated by the arrow, tracked working points 112-115 are set. If a PV-generator is operated at one of the tracked working point 112-115 and the voltage U measured at S302 is accordingly lower than expected, the presence of an arc is indicated. In particular for a single module used as the PV-generator, the voltage drop along a series arc can amount to up to 30% of the open-loop voltage, which leads to voltage U measured that is clearly out of expected range.

In the case of a parallel arc 7 burning in parallel to the PV-generator, the measured voltage U equals the mentioned height of the voltage drop along a burning arc, which is also clearly out of the expected range.

It is noted that circumstances other than a burning arc could as well lead to a measured voltage outside the expected range. If, for example, the intensity of the incident sunlight is low, the MPP-tracker could set a working point outside the voltage range expected during normal operation. However, such circumstances or working conditions can usually be identified. A low intensity of the incident sunlight can for example be identified by a low photovoltaic current I.

Figure 5:
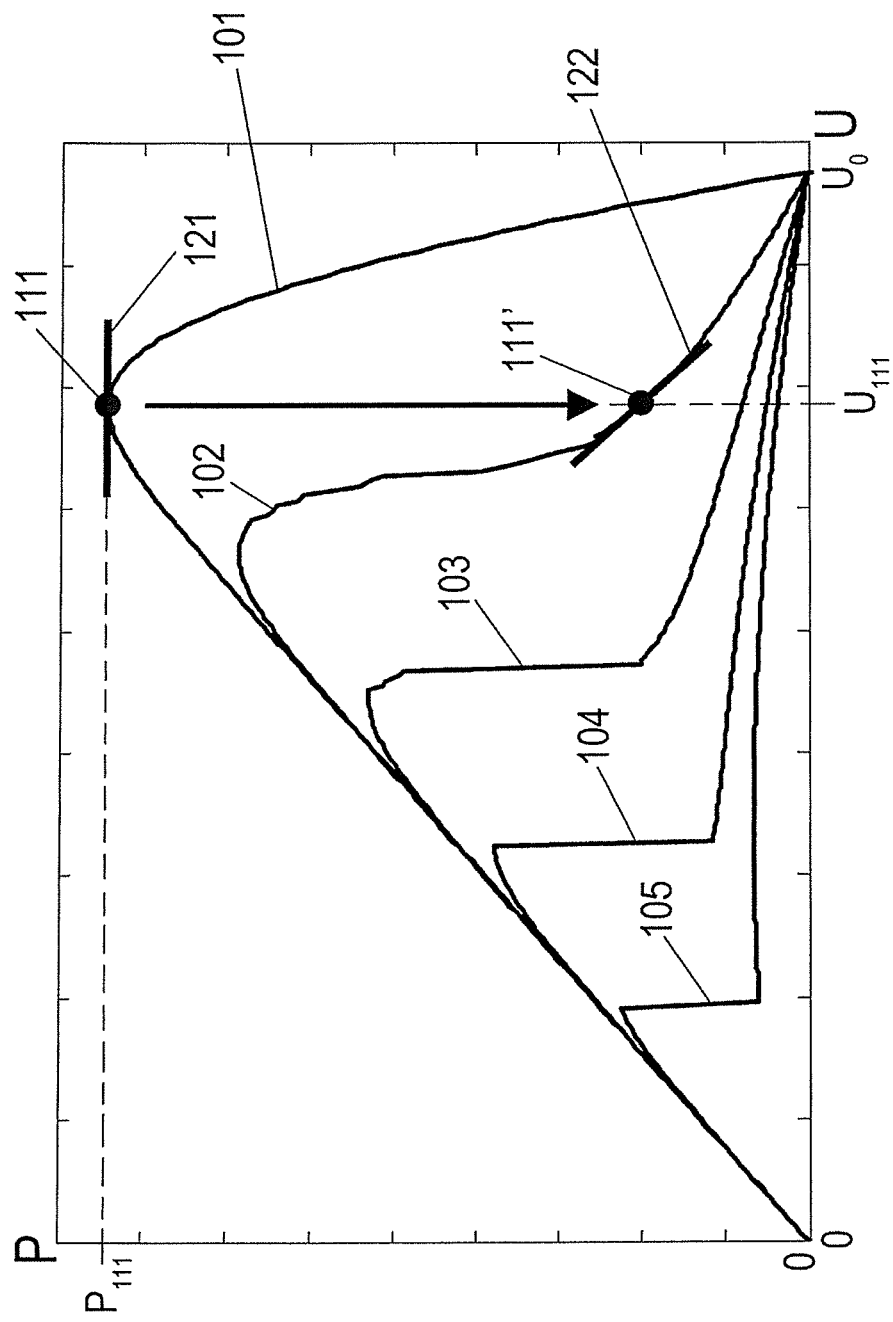
FIG. 5 a further diagram of P/V-curves of a photovoltaic generator.

A second indication is given by a change in the slope of a characteristic P/V-curve. FIG. 5 shows the same P/V-curves 101-105 as FIG. 4 for an explanation of this indication. The MPP-tracker continuously determines the slope of a P/V-curve, e.g. the P/V-curve 101 during normal operation, in order to be able to follow its maximum by a steady back-and-forth variation of the working voltage. In the example shown, it is assumed that the PV-generator has first been operated along the P/V-curve 101 at the tracked working point 111 (normal operation). The P/V-curve 101 has a slope 121 at the working point 111. It is further assumed that then a series arc has developed, leading to a change in the characteristics according to the further P/V-curve 102 as indicated by the arrow. Before the MPP-tracker is able to "follow" the P/V-curve 102 to its maximum, the working point is still located at the voltage value $U_{111}$ associated with the working point 111. The resulting intermediate working point is denoted as untracked working point 111'. At this untracked working point 111', the P/V-curve 102 has a slope 122 that differs considerably from the slope 121. Accordingly, a measurement of the slope of the characteristic P/V-curve at the actual working point as performed by the MPP-tracker shows a sudden change of the slope from the value of the (tracked) slope 121 to the (untracked) slope 122. A rapid change in the slope can thus be seen as an indication of the development of an arc.

Figure 6:
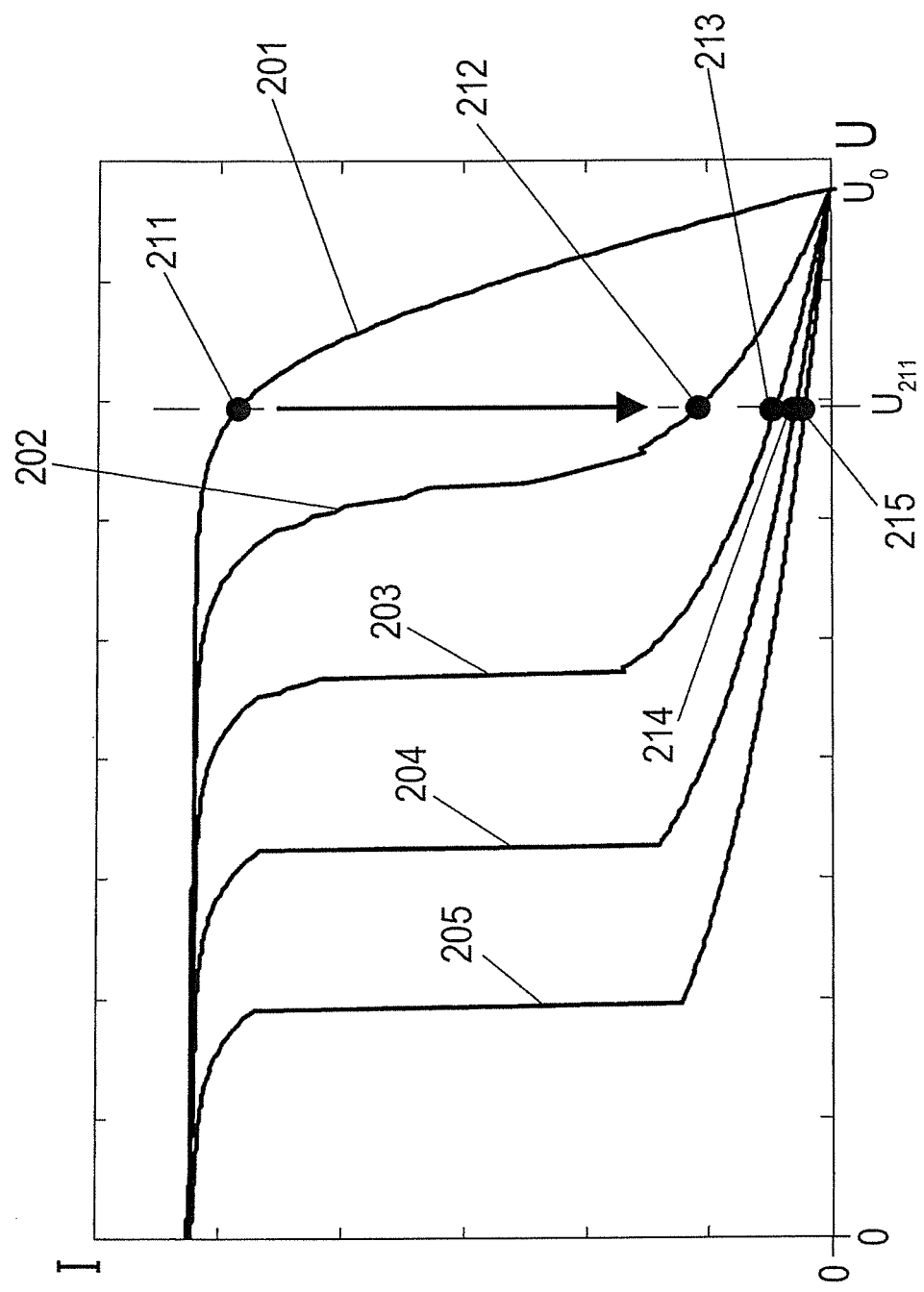
FIG. 6 a diagram of I/V-curves of a photovoltaic generator.

A third indication is given by an unexpected jump in the current I. Due to the voltage drop along a series arc as described above, a new optimal working point is located at lower voltages. Reference is made to FIG. 6 that shows characteristic I/V (current vs. voltage)-curves of a PV-generator, e.g. the PV-generator 2 of FIG. 1, in a diagram. The operating voltage U of the PV-generator is recorded on the x-axis of the diagram; the current I drawn from the PV-generator is recorded on the y-axis of the diagram.

I/V-curve 201 shows the characteristics of the PV-generator during its normal operation, while further I/V-curves 202-205 show the characteristics of the PV-generator while series arcs with different parameters are burning. It is assumed that the PV-generator first operates at working point 211 under normal working conditions. When an arc starts to burn, the MPP-tracker at first still keeps the voltage of the former working point as indicated by the arrow (similar to the case described above in connection with the second indication), which is now related to a lower current at one of the working point 212-215. Thus, a series arc starting to burn leads to an abrupt drop of the measured current I. Only then the MPP-tracker drifts towards lower operating voltages and finally locks on a new MPP. The value of the current I then recovers to the former value. Similarly, a rapid change in the delivered power P can be regarded as an indication of the presence of an arc.

A fourth indication is given by a flickering voltage U or current I: The voltage drop along an arc is not constant with time. Accordingly, the measured voltage U and the measured current I vary in time.

If an indication of the presence of an arc has been detected, the method continues at S305. So far, only indications for an arc have been observed. It has to be kept in mind that other operating conditions, e.g. shadowing of the PV-generator, are also connected with a change in the characteristic P/V- or I/V-curves. Such changes could be misinterpreted as indications for the presence of an arc. Act S305 and the following acts now serve to validate whether an arc is in fact present or not. For that purpose, the PV-generator 2 is operated under significantly different working conditions at a second working point at S305.

In one embodiment of the method, the second working point assumed at S305 corresponds to setting the current I to zero, e.g. by opening all switches 53-56 of the inverter bridge of the inverter 5.

In a following act S306, the DC-current I flowing in the power circuit and the DC-voltage U provided by the PV-generator are measured again. The measured values are referred to as the second signal.

At S307 the first and the second signal are compared. If no arc had been present before, the capacitor would be charged up to the open-loop voltage. Accordingly, the voltage U would rise and a charging current would be observed. Even if shadowing were present, the voltage would rise up to the open-loop voltage $U_0$. If a serial arc 8 had been present before, current would flow as long as the capacitor would take up charge. However, due to the voltage drop along the arc, the voltage of the capacitor would not exceed a value corresponding to $U_0$ minus the voltage drop. Then, at the latest, no current would flow anymore and the arc would be extinguished. If a parallel arc 7 had been present before, it would not or only to a very minor extent be affected by setting a new working point and accordingly no significant changes between the first and the second signal could be observed. It is noted that small changes could occur due to a different current carried by the arc.

The three different scenarios that could have been present before act S306 (no arc, serial arc, parallel arc) thus lead to three different reactions of the measured voltage and/or current, which reflects in the comparison of the second signal with the first signal.

At S308, the result of the comparison is analyzed and depending on the result, the presence of an arc is indicated at S309 or the method branches back to S301, where normal operation is resumed. Normal operation can be resumed at the former first working point. Alternatively, a search method for finding a global MPP can be performed in order to find a new first working point. Suitable search methods are known in the art and are therefore not described in more detail here.

In another embodiment of the method, the second working point assumed at S305 corresponds to reducing the voltage and/or the current significantly, e.g. to half or third of the voltage or current of the first working point. This also leads to different reactions of the measured voltage and/or current and in particular to a different dynamic behavior dependent on the presence of an arc.

Alternatively or additionally, a validation whether an arc is in fact present or not after it has been indicated can also be performed by comparing measured characteristic curves, e.g. P/V- or I/V-curves, with expected characteristic curves. Expected characteristic curves can e.g. either be formerly measured curves that were recorded under known operating conditions (normal, partial shadowing, etc.) or that are simulated or calculated.

It is finally noted that the foregoing description and the drawings are exemplary and not restrictive and that the disclosure is not limited to the disclosed embodiments. Other variations to the disclosed embodiments can be understood and effected by those skilled in the art from a study of the drawings, the disclosure, and the appended claims.

The invention claimed is:

1. A method for detecting an arc fault in a photovoltaic power circuit comprising a photovoltaic generator, comprising:
    operating the photovoltaic generator at a first working point;
    determining a first signal related to a DC-current flowing in the power circuit and/or a DC-voltage present in the power circuit;
    analyzing the first signal and determining whether the first signal indicates a presence of an electric arc in the power circuit;
    in case the first signal indicates the presence of an electric arc in the power circuit, operating the photovoltaic generator at a second working point;
    determining a second signal related to the DC-current flowing in the power circuit and/or the DC-voltage present in the power circuit;
    comparing the first signal and the second signal; and
    signaling the occurrence of an arc fault in the power circuit if a result of the comparison indicates the presence of an electric arc.

2. The method of claim 1, wherein analyzing the first signal comprises determining whether the first signal shows an unexpected value for the DC-voltage and/or the DC-current and/or an unexpected value for a derivative with respect to time of the DC-voltage and/or of the DC-current, and wherein an observation of such an unexpected value is regarded as an indication of the presence of an electric arc.

3. The method of claim 1, wherein the second working point is distinctly different from the first working point.

4. The method of claim 3, wherein the second working point corresponds to operating the PV-generator at its open-loop voltage.

5. The method of claim 4, wherein the occurrence of an arc fault is signaled if the DC-voltage determined as the second signal is lower than the open-loop voltage.

6. An arc fault detection system for detecting an electric arc in a photovoltaic generator system comprising a control unit, wherein the control unit is configured to:
    operate the photovoltaic generator system at a first working point:
    determine a first signal related to a current flowing into or out of the power circuit and/or a DC-voltage present at an input or an output of the power circuit;
    analyze the first signal and determining whether the first signal indicates a presence of an electric arc in the power circuit;
    in case the first signal indicates the presence of an electric arc in the power circuit, operate the photovoltaic generator at a second working point;
    determine a second signal related to the current flowing into or out of the power circuit and/or the voltage present at the input or output of the power circuit;
    compare the first signal and the second signal; and
    signal the occurrence of an arc fault in the power circuit if a result of the comparison indicates the presence of an electric arc.

7. An inverter for a photovoltaic power system, the inverter configured to receive a DC input voltage at DC input lines and generate an AC voltage at AC output lines, the inverter comprising:
    a control unit with an integrated arc fault detection system, configured to receive an input voltage or input current as inputs, or receive an output voltage or output current as inputs at two distinctly different working points, compare the inputs at the two distinctly different working points, and selectively signal an occurrence of an electric arc based on the comparison.

8. The inverter according to claim 7, wherein the inverter is integrated into a PV-module.

9. The inverter of claim 7, wherein the control unit receives an input voltage or input current as inputs, or receives an output voltage or output current as inputs at the second working point only if the received input voltage, input current, output voltage or output current at the first working point indicates a presence of an arc fault.

10. A method for detecting an arc fault in a photovoltaic power circuit comprising a photovoltaic generator, comprising:
    operating the photovoltaic generator at a first working point;
    determining a first signal related to a current flowing into or out of the power circuit and/or a DC-voltage present at an input or an output of the power circuit;
    analyzing the first signal and determining whether the first signal indicates a presence of an electric arc in the power circuit;
    in case the first signal indicates the presence of an electric arc in the power circuit, operating the photovoltaic generator at a second working point;
    determining a second signal related to the current flowing into or out of the power circuit and/or the voltage present at the input or output of the power circuit;
    comparing the first signal and the second signal; and
    signaling the occurrence of an arc fault in the power circuit if a result of the comparison indicates the presence of an electric arc.

11. The method of claim 10, wherein the voltage is a DC input voltage and the current is a DC input current, and wherein analyzing the first signal comprises determining whether the first signal shows an unexpected value for the DC input voltage and/or the DC input current and/or an unexpected value for a derivative with respect to time of the DC input voltage and/or of the DC input current, and wherein an observation of such an unexpected value is regarded as an indication of the presence of an electric arc.

* * * * *